(12) United States Patent
Saveliev

(10) Patent No.: US 7,825,384 B1
(45) Date of Patent: Nov. 2, 2010

(54) QUANTUM DETECTOR ARRAY

(75) Inventor: Valeri Saveliev, Hamburg (DE)

(73) Assignee: Positron Corporation, Fishers, IN (US)

(*) Notice: Subject to any disclaimer, the term of this patent is extended or adjusted under 35 U.S.C. 154(b) by 84 days.

(21) Appl. No.: 12/251,859

(22) Filed: Oct. 15, 2008

Related U.S. Application Data

(60) Provisional application No. 60/960,812, filed on Oct. 15, 2007.

(51) Int. Cl.
*G01T 1/24* (2006.01)
(52) U.S. Cl. .................................. 250/370.01
(58) Field of Classification Search ..................
250/370.01–370.15, 214.1, 214 R; 378/98.6–98.8;
257/260, 499, 929, 638, 257, 290–292
See application file for complete search history.

(56) References Cited

U.S. PATENT DOCUMENTS

| | | | |
|---|---|---|---|
| 4,647,781 A | 3/1987 | Takagi et al. | |
| 5,025,151 A | 6/1991 | Melcher | |
| 5,378,911 A * | 1/1995 | Murakami | 257/334 |
| 5,453,623 A | 9/1995 | Wong et al. | |
| 5,484,750 A | 1/1996 | Greskovich et al. | |
| 5,600,145 A | 2/1997 | Plummer | |
| 5,864,146 A | 1/1999 | Karellas | |
| 6,281,504 B1 | 8/2001 | Takayama et al. | |
| 6,630,077 B2 | 10/2003 | Shiang et al. | |
| 6,793,848 B2 | 9/2004 | Vartuli et al. | |
| 6,885,827 B2 | 4/2005 | Shushakov et al. | |
| 7,008,558 B2 | 3/2006 | Vartuli et al. | |
| 7,084,403 B2 | 8/2006 | Srivastava et al. | |
| 7,085,502 B2 | 8/2006 | Shushakov et al. | |
| 7,115,875 B1 | 10/2006 | Worstell | |
| 7,535,011 B2 | 5/2009 | Chowdhury et al. | |
| 2001/0032934 A1 * | 10/2001 | Lee et al. | 250/370.09 |
| 2003/0080298 A1 | 5/2003 | Karplus et al. | |
| 2005/0012033 A1 | 1/2005 | Stern | |

(Continued)

FOREIGN PATENT DOCUMENTS

WO  WO 2007/126074   10/2007

(Continued)

OTHER PUBLICATIONS

Saveliev, "The recent development and study of silicon photomultiplier,", 2004, Nuclear Instruments and Methods in Physics Research, vol. A 535, pp. 528-532.*

(Continued)

*Primary Examiner*—David P Porta
*Assistant Examiner*—Kiho Kim
(74) *Attorney, Agent, or Firm*—Berenato & White, LLC

(57) ABSTRACT

A quantum detector array is provided. The array includes a semiconductor substrate and an epitaxial layer on the semiconductor substrate. The epitaxial layer includes a plurality of binary quantum sensor elements operable in breakdown mode to generate signals, logic elements, and a digital processing circuit. The binary quantum sensor elements each have a radiation-sensitive drift region and amplification region with a pn junction for detecting radiation from a radiation-emission source. The logic elements are each electrically interconnected to a corresponding binary sensor element of the plurality of binary quantum sensor elements for resetting the corresponding binary sensor element, generating digital information based on the signals received from the corresponding binary sensor element, and outputting the digital information. The digital processing circuit carries out digital processing of logic and time signals from the binary sensor elements.

5 Claims, 2 Drawing Sheets

U.S. PATENT DOCUMENTS

2006/0124832 A1 6/2006 Harmon et al.
2008/0156993 A1 7/2008 Weinberg et al.

OTHER PUBLICATIONS

Okamura et al., "A light-transmitting two-dimensional photodetector array using a a-Si pin photodiodes and poly-Si TFT's Integrated on a Transparent substrate," 1994, IEEE Transactions on Electron Devices, vol. 41, No. 2, pp. 180-185.*
Stewart et al., "Study of the properties of new SPM detectors," 2006, Proceedings of SPIE, Semiconductor Photodetectors III, vol. 6119.*
Meng et al., "Effects of electron and gamma-ray irradiation on CMOS analog image sensors," 2003, Elsevier Microelectronics Reliability, vol. 43, pp. 1151-1155.*
Tan et al., "High-voltage accumulation-layer UMOSFET's in 4H-SiC," 1998, IEEE Electron Device Letters, vol. 19, No. 12, pp. 487-489.*
A. D. Lucas, "Epitaxial silicon avalanche photodiode," 1974, Optoelectronics, Vo. 6, pp. 153-160.*
Pal et al., "Small-signal analysis of a p-n junction avalanche diode having a uniform avalanche zone and a drift zone for unequal ionization rates and drift velocities of electrons and holes," 1971, Journal of Physics D: Applied Physics, vol. 4, pp. 2041-2048.*
Hamamatsu, MPPC Multi-Pixel Photon Counter, Nuclear Science Symposium, Oct. 29 to Nov. 4, 2006, 1-14 pgs, San Diego, California, USA.
Jackson et al., A Novel Silicon Geiger-Mode Avalanche Photodiode, Proceedings IEDM, 32-2, Dec. 2002.
V. Golovin et al., Novel type of avalance photodetector with Geiger mode operation, Nuclear Instruments and Methods in Physics Research A 518 (2004) 560-564.
Lempicki et al., LuAIO3:Ce and other aluminate scintillators, IEEE, Transactions on Nuclear Science, pp. 307-311 (1995).
Lempicki et al., LuAIO3: Ce and other aluminate scintillators, IEEE Transactions on Nuclear Science, vol. 42, No. 4, pp. 280-284 (1995).
Nikl et al., Traps and timing characteristics of LuAG:Ce3+ scintillator, Phys. Stat. Sol. 181 (2000).
Li et al., Fabrication of transparent cerium-doped lutetium aluminum garnet . . . Method, J. Am. Ceram. Soc. 88[11] 3226-3228 (2005).
Moehrs et al., A detector head design for small animal PET with silicon photomultipliers (SiPM), Phys. Med. Biol. 51, 1113-1127 (2006).
Zappa, Spada: Single-photon avalanche diode arrays, IEEE Photonics Technology Letters, vol. 17, No. 3, 657-59 (2005).
Aull, et al., Geiger-mode avalanche photodiodes for three-dimensional imaging, Lincoln Lab. Journal, vol. 13, No. 2, 335-350 (2002).
Saveliev, Silicon photomultiplier: Physics, development and applications, Obninsk State University, Russia/ DESY, Hamburg (May 19, 2006) (pp. 1-36).
V. Saveliev et al., Silicon avalanche photodiodes . . . metal resistor-semiconductor MRS structures, Nuclear Instruments and Methods in Physics Research A 442 (2000) 223-229.
V. Saveliev, The recent developments and study of silicon photomultiplier, Nuclear Instruments and Methods in Physics Research A535 (2004) 528-532.
V. Saveliev, Silicon-photomultiplier: recent developments and results, Oral Presentation IEEE, NSS2004, pp. 1-20 (2001).
D. McElroy, et al., Evaluation of silicon photomultipliers: A promising . . . compatible PET, Nuclear Instruments and Methods in Physics Research A571 (2007) 106-09.
V. Saveliev, SiPM resent development and applications, Oral Presentation at 4th Beaune Conference on new developments in photodetectors (2005, France) pp. 1-24.
V. Saveliev, SiPM Resent development and study, Oral Presentation on IEEE 2005 (2005), pp. 1-20.
A.G. Stewart, et al., Study of the properties of new SPM detectors, Proceedings of SPIE: Semiconductor Photodetectors III, vol. 6119 (2006) (10 pages).
Motomura et al., "Development of a lead x-ray compensation method in simultaneous T1-201 SPECT & . . . ", IEEE Transactions on Neclear Science, vol. 44, No. 6 (Dec. 1997) 2459-64.
Saveliev, Physics, Development and Applications, Obninsk State University, Russia/DESY, Hamburg (May 4, 2006) (pp. 1-41).
International Search Report for WO 2007/120674.
Mar. 24, 2009 Office Action for U.S. Appl. No. 11/783,613.

* cited by examiner

US 7,825,384 B1

QUANTUM DETECTOR ARRAY

CROSS-REFERENCE TO RELATED APPLICATION(S)

This patent application claims the benefit of priority of U.S. provisional application 60/960,812 filed on Oct. 15, 2007, the complete disclosure of which is incorporated herein by reference.

FIELD OF THE INVENTION

The present invention relates to photodetectors, including binary quantum photodetectors for converting photon flux into proportional semi-digital or digital electric signals with high efficiency and fidelity. The present invention further relates to devices, apparatus, systems, and methods of making and employing quantum photodetectors. The present invention possesses wide applicability, including in the fields of medical imaging, homeland security, and civilian and military applications involving the detection of low photon flux intensity.

BACKGROUND OF THE INVENTION

Photo detectors are employed in many applications requiring low intensity radiation detection, such as medical imaging systems (e.g., positron emission tomography (PET)), homeland security systems, experimental high energy physics and other systems and technology. Important considerations in the selection of photo detectors are intrinsic gain, linearity and dynamic range, accuracy, recovery time, and background conditions and also signal processing, especially for the large scale detecting systems. High intrinsic gain in low intensity radiation detection allows for high performance detection, e.g., up to single photon sensitivity at room temperature and high signal-to-noise ratios, and reduces the requirements to front end electronics. Linearity and high dynamic range are important towards providing accurate measurements of the radiation energy absorbed, for example, by scintillation materials in medical imaging systems. High accuracy measurements permit discrimination of gamma-rays that have been scattered within a material or a (patient's) body. Scattered gamma-rays provide less reliable information about the distribution of gamma-ray sources in the patient's body than unscattered gamma-rays. Short recovery times are important towards achieving good performance in high gamma-ray environments, such as in cardiac scans with short-lived radioisotopes (e.g., Rb-82). Short response times are important in order to accurately measure the gamma-ray detection time, which is of particular interest in PET scanner operations, where locations of gamma ray emissions are determined by the coincident detection of gamma rays by a pair of detectors. Background conditions can contribute to "dark current events," such as generated by the thermally created carriers inside a sensitive area. A dark current event is typically attributable to defects in or thermal variations experienced by a photo detector. Dark current events often cannot be distinguished from the intended signal generated by the detection of a photon in micro cell. Dark rate is best kept at a minimum in order to yield high signal-to-noise ratio.

Other important considerations for many low intensity radiation detection applications include operation conditions, stability, expected working conditions (e.g., a high electromagnetic and radiation field environment), physical size and fabrication cost. Operation conditions such as low bias voltage stability are important, especially for interventional devices (e.g., intra-operative cameras), in order to reduce the possibility of electric shock to a patient, sensitive technology (e.g., space technology), and mobile systems. The photo detector fabrication cost represents a significant fraction of the expense associated with the medical imaging systems, and therefore is desirably minimized.

Low intensity photon flux detection generally employs conventional photomultiplier tubes (PMT) and the related hybrid photon detector (HPD) technology. These technologies have several advantages, such as high gain (e.g., one million or higher), good linearity, and low dark current. However, these conventional technologies also have disadvantages, such as large size, high voltage, sensitivity to ambient magnetic fields, complexity, an analog operation mode and analog output signals, and high expense.

The publication of V. Golovin and V. Saveliev, entitled "Novel type of avalanche photodetector with Geiger mode operation," Nuclear Instruments and Methods in Physics Research" 518 (2004) 560-564 discloses an semiconductor avalanche photodetector structure having multiple Geiger mode operation cells with implemented quenching mechanisms and a common electrode, referred to as a silicon photomultiplier. The silicon photomultiplier is described as a plurality of avalanche diodes (also referred to as micro-cells) on a single substrate with an implemented quenching mechanism (resistive layer) and a common electrode. An absorbed photon entering the micro-cell generates an electron-hole pair. Due to a high electric field inside of the micro-cell, a drifting electron can generate a large number of electron-hole pairs via an avalanche process, resulting in breakdown process of the pn junction of micro-cell. The resistive layer is covered over the avalanche structure of the micro-cell for the purpose of quenching the avalanche process in the micro-cell. The common electrode provides the proportional mode of detecting of low photon flux. The performance of this semiconductor structures is comparable with or higher than the performance of photomultiplier tubes, permitting these semiconductor devices to be substituted for the photomultipliers tubes of old vacuum glass radio device technology.

A new approach presented herein is based on the methods and structures which use the binary (digital) feature of the quantum photodetector structures for the signal processing in the sensor structure and provides a wide range of improvement with respect to the structure itself and signal processing.

SUMMARY OF THE INVENTION

According to an aspect of the invention, a quantum detector array is provided. The array includes a semiconductor substrate and an epitaxial layer on the semiconductor substrate. The epitaxial layer includes a plurality of binary quantum sensor elements operable in nonlinear breakdown mode in response to detection of a single photon to generate signals, logic elements, and a digital processing circuit. The binary quantum sensor elements each have a radiation-sensitive drift region and amplification region with a pn junction for detecting radiation from a radiation-emission source. The logic elements are each electrically interconnected to a corresponding binary sensor element of the plurality of binary quantum sensor elements for resetting the corresponding binary sensor element from the nonlinear breakdown mode, generating digital information based on the signals received from the corresponding binary sensor element, and outputting the digital information. The digital processing circuit carries out digital processing of logic and time signals from the binary sensor elements.

Other aspects of the invention, including devices, structures, assemblies, systems, arrays, meta-arrays, methods, and the like which constitute part of the invention, will become more apparent upon reading the following detailed description of the exemplary embodiments and viewing the drawings.

BRIEF DESCRIPTION OF THE DRAWINGS

The accompanying drawings are incorporated in and constitute a part of the specification. The drawings, together with the general description given above and the detailed description of the exemplary embodiments and methods given below, serve to explain the principles of the invention. In such drawings.

DETAILED DESCRIPTION OF EXEMPLARY EMBODIMENTS OF THE INVENTION

Figure 1:
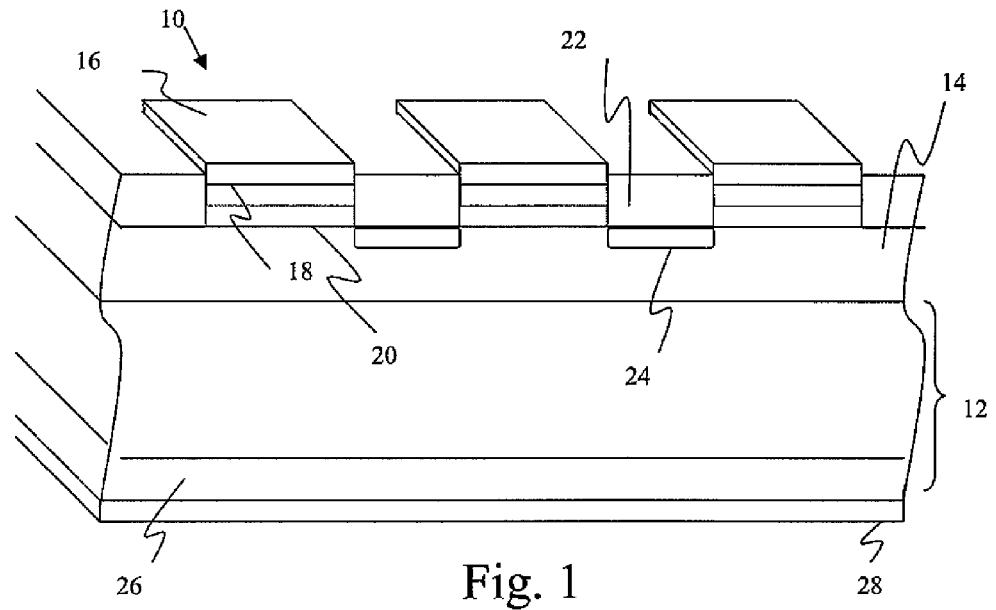
FIG. 1 is a side sectional view of a digital quantum detector structure including logic elements according to an exemplary embodiment of the invention.

Reference will now be made in detail to the exemplary embodiments and methods of the invention as illustrated in the accompanying drawings, in which like reference characters designate like or corresponding parts throughout the drawings. It should be noted, however, that the invention in its broader aspects is not limited to the specific details, representative devices and methods, and illustrative examples shown and described in this section in connection with the exemplary embodiments and methods.

Figure 2:
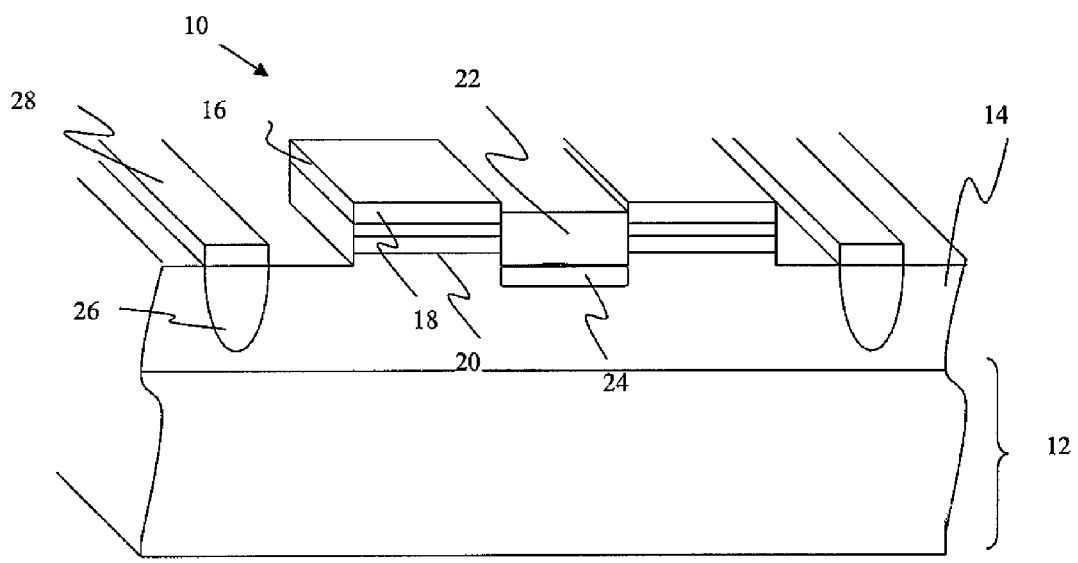
FIG. 2 is a side sectional view of a digital quantum detector structure including logic elements according to another exemplary embodiment of the invention.

FIGS. 1 and 2 depict a binary quantum detector array according to exemplary embodiments of the invention.

The quantum photodetector arrays, generally designated by reference numeral 10 in FIGS. 1 and 30 in FIG. 2, present a realization of the binary quantum photodetector through the application of CMOS compatible and CMOS technology.

The semiconductor structure of binary quantum photodetector includes a semiconductor substrate 12 such as silicon or other semiconductor materials such as gallium arsenide, silicon-germanium, etc. An epitaxial layer 14 is formed on top of the substrate using known deposition techniques. The epitaxial layer 14 is likewise made of a semiconductor material such as silicon.

Binary quantum sensor elements for detecting photons are generally designated by reference numeral 16. The sensor elements are formed in the epitaxial layer 14 using an implantation process. The sensor elements 16 each include a breakdown/amplification area 18 composed of an $n^+$-type region or layer, and a p-type region or layer immediately adjacent to $n^+$-type region to establish an avalanche pn junction. (The terms "layer" and "region" are used interchangeably herein.) The sensor elements 16 further include drift areas 20 located under the breakdown/amplification areas 18. The drift areas 20 are also formed by implantation, but the concentration of p-dopant in the drift areas 20 is lower than in the breakdown areas 20. The drift areas 20 provide increased efficiency without introducing noise. The binary sensor elements are typically microns range size. Creation of the $n^+$-type region, p-type region, and the drift areas may be accomplished, for example, using standard doping techniques and CMOS compatible or standard CMOS technology.

The sensor elements 16 are separated from one another by trenches 22 formed in the epitaxial layer 14. The trenches 22 may be formed using dry or wet etching techniques. The trenches 22 may be filled with non transparent material which assists in suppressing optical crosstalk between the sensor elements 16.

The binary quantum detector array 10 further includes integrated logic elements 24 in the epitaxial layer 14. The logic elements 24 are formed below the trenches 22 between the sensor elements 16, preferably at least partially and more preferably completely outside of the radiation-sensitive area of the sensor elements 16. By positioning the logic elements 24 in the area at the bottom of the trenches 22, a substantial portion or an entirety of the radiation-sensitive area of the sensor elements 14 is available to detect the radiation without obstruction from the logic element 24. The logic elements 24 are each electrically interconnected to a corresponding one of the binary quantum sensor elements 16. Integration of the logic elements with the sensor technology can be accomplished using known CMOS technology. The logic elements 24 may be passive or active, depending on the type of the output (semi-digital or digital), and can include the digital processing schematic for processing the digital information generated by the binary quantum elements.

The second contact of the binary quantum photodetector structure is formed on the lower or "back" side of the substrate 12 in the case of CMOS compatible technology (FIG. 1) or on the top surface outside sensitive area in case CMOS technology (FIG. 2). The second contact includes a p+ layer 26 formed by implantation processes and metal electrode 28.

An example of a manner for operating the above exemplary embodiment will now be described. It should be understood that the exemplary embodiment is not limited to this embodied operation.

The sensor elements 16 operate in breakdown mode (with infinity gain of amplification). Photons incident on the sensitive area of a sensor element 16 create carriers inside the drift region and partially the p-region of the pn-junction, triggering an avalanche process, and generating a signal. The signal is received by the corresponding logic element 24, which generates a semi-digital or digital logic signal, i.e., binary information.

Figure 3:
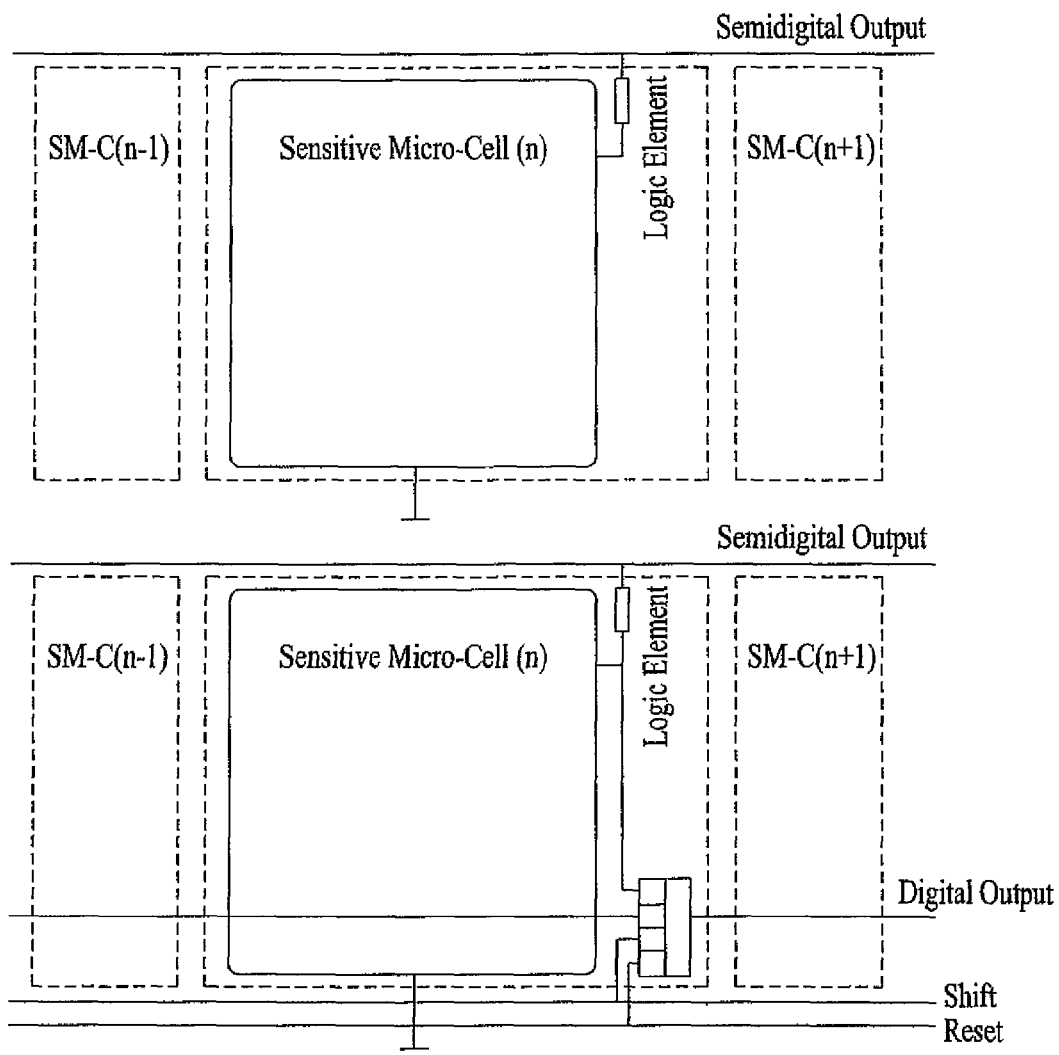
FIG. 3 includes schematic views of digital quantum photodetectors with (a) semi-digital and (b) digital output, including a digital processing circuit.

As shown in FIG. 3, the digital signal is output to a readout circuit by way of, for example, a common bus.

Digital signal readout of the sensor elements 14 may be organized in various manners, such as parallel and/or serial format.

It should be understood that various modifications, alterations, and other changes to the exemplary embodiment are contemplated and fall within the scope of the invention. For example, the p-type and $n^+$-regions and the biasing means may be reversed to operate the sensor elements 14 in breakdown mode with respective to different sensitivity ranges of light, particularly UV light.

Sensor elements, arrays, pixels, meta-arrays, and read-out components and systems useful with or adaptable for use with this invention are described in U.S. patent application publication 2008/0156993 (Ser. No. 11/783,613) entitled "Quantum Photodetectors, Imaging Apparatus and Systems, and Related Methods" filed Apr. 10, 2007 to Weinberg, et al., the complete disclosure of which is hereby incorporated herein by reference.

Additional advantages and modifications will occur to those skilled in the art. Therefore, the invention in its broader aspects is not limited to the specific details, representative devices and methods, and illustrative examples shown and described. Accordingly, departures may be made from such details without departing from the spirit or scope of the general inventive concept.

What is claimed is:

1. A quantum detector array, comprising:

a semiconductor substrate; and an epitaxial layer on the semiconductor substrate, the epitaxial layer comprising:

a plurality of binary quantum sensor elements operable in nonlinear breakdown mode in response to detection of a single photon to generate signals, the binary quantum sensor elements each having a radiation-sensitive drift region and amplification region with a pn junction for detecting radiation from a radiation-emission source;

logic elements each electrically interconnected to a corresponding binary sensor element of the plurality of binary quantum sensor elements for resetting the corresponding binary sensor element from the nonlinear breakdown mode, generating digital information based on the signals received from the corresponding binary sensor element, and outputting the digital information; and a digital processing circuit for digital processing of logic and time signals from the binary sensor elements.

2. The quantum detector array of claim 1, wherein the logic elements are positioned at least partially outside of the radiation-sensitive area of its corresponding sensor element to leave at least a portion of the radiation-sensitive area available to detect the radiation without obstruction from the logic element.

3. The quantum detector array of claim 1, wherein the binary quantum sensor elements are separated from one another by trenches for reducing optical cross-talk between the binary quantum sensor elements.

4. The quantum detector array of claim 3, wherein the logic elements are disposed in the epitaxial layer under the trenches.

5. The quantum detector array of claim 1, further comprising common digital signal processing electronics and common output electrodes for communicating with an array of quantum detectors formed on the semiconductor substrate.

* * * * *